(12) United States Patent
McNally et al.

(10) Patent No.: US 12,324,099 B2
(45) Date of Patent: Jun. 3, 2025

(54) VEHICULAR OVERHEAD CONSOLE WITH FLEXIBLE CIRCUIT BOARD

(71) Applicant: Magna Mirrors of America, Inc., Holland, MI (US)

(72) Inventors: Michael T. McNally, Caledonia, MI (US); Kevin M. Wright, Lansing, MI (US); Mark L. Larson, Grand Haven, MI (US); John T. Uken, Jenison, MI (US)

(73) Assignee: Magna Mirrors of America, Inc., Holland, MI (US)

( * ) Notice: Subject to any disclaimer, the term of this patent is extended or adjusted under 35 U.S.C. 154(b) by 268 days.

(21) Appl. No.: 18/176,536

(22) Filed: Mar. 1, 2023

(65) Prior Publication Data

US 2023/0284386 A1  Sep. 7, 2023

Related U.S. Application Data

(60) Provisional application No. 63/268,854, filed on Mar. 4, 2022.

(51) Int. Cl.
*H05K 1/14* (2006.01)
*B60Q 3/51* (2017.01)
*H05K 1/02* (2006.01)
*H05K 1/18* (2006.01)

(52) U.S. Cl.
CPC ............ *H05K 1/145* (2013.01); *B60Q 3/51* (2017.02); *H05K 1/028* (2013.01); *H05K 1/189* (2013.01); *H05K 2201/10356* (2013.01)

(58) Field of Classification Search
CPC ........ H05K 1/145; H05K 1/028; H05K 1/189; H05K 2201/10356; B60Q 3/51
See application file for complete search history.

(56) References Cited

U.S. PATENT DOCUMENTS

| | | | |
|---|---|---|---|
| 5,594,222 | A | 1/1997 | Caldwell |
| 6,001,486 | A | 12/1999 | Varaprasad et al. |
| 6,310,611 | B1 | 10/2001 | Caldwell |
| 6,320,282 | B1 | 11/2001 | Caldwell |
| 6,369,804 | B1 | 4/2002 | Sandbach |
| 6,437,258 | B1 | 8/2002 | Sandbach |
| 6,452,479 | B1 | 9/2002 | Sandbach |

(Continued)

FOREIGN PATENT DOCUMENTS

WO  2023062132 A1  4/2023

*Primary Examiner* — Jeremy C Norris
(74) *Attorney, Agent, or Firm* — HONIGMAN LLP

(57) ABSTRACT

A vehicular overhead console module includes a base portion configured to attach at an interior portion of a vehicle, a primary printed circuit board (primary PCB) accommodated by the base portion, and a secondary printed circuit board (secondary PCB) accommodated by the base portion and spaced from the primary PCB. The secondary PCB is electrically connected to an electronic component accommodated by the base portion and includes electronic circuitry associated with the electronic component. Electronic circuitry of the primary PCB includes a processor for processing electronic signals received from the secondary PCB. The primary PCB and the secondary PCB are secured at the base portion via one or more press-fit pins of the base portion. A flexible electrical connection electrically connects the primary PCB and the secondary PCB and flexes to conform to an inner surface of the base portion.

25 Claims, 8 Drawing Sheets

(56) References Cited

U.S. PATENT DOCUMENTS

| | | |
|---|---|---|
| 6,492,980 B2 | 12/2002 | Sandbach |
| 6,501,465 B2 | 12/2002 | Sandbach |
| 6,504,531 B1 | 1/2003 | Sandbach |
| 6,627,918 B2 | 9/2003 | Getz et al. |
| 7,224,324 B2 | 5/2007 | Quist et al. |
| 7,249,860 B2 | 7/2007 | Kulas et al. |
| 7,253,723 B2 | 8/2007 | Lindahl et al. |
| 7,255,541 B2 | 8/2007 | Kuramoto et al. |
| 7,360,932 B2 | 4/2008 | Uken et al. |
| 7,446,924 B2 | 11/2008 | Schofield et al. |
| 10,272,833 B2 | 4/2019 | Snider |
| 10,427,503 B2 | 10/2019 | Snider |
| 10,559,153 B2 | 2/2020 | Snider et al. |
| 11,639,134 B1 | 5/2023 | Huizen et al. |
| 11,780,372 B2 | 10/2023 | Sobecki et al. |
| 11,833,972 B1 | 12/2023 | Solar et al. |
| 11,840,174 B2 | 12/2023 | Chao et al. |
| 11,970,111 B2 | 4/2024 | Uken et al. |
| 2006/0050018 A1 | 3/2006 | Hutzel et al. |
| 2014/0022390 A1 | 1/2014 | Blank et al. |
| 2014/0293169 A1 | 10/2014 | Uken et al. |
| 2020/0031286 A1 | 1/2020 | Larson et al. |
| 2021/0188092 A1 | 6/2021 | Peterson |
| 2023/0078512 A1 | 3/2023 | Peterson et al. |
| 2023/0286441 A1 | 9/2023 | Schnellbach et al. |

VEHICULAR OVERHEAD CONSOLE WITH FLEXIBLE CIRCUIT BOARD

CROSS REFERENCE TO RELATED APPLICATION

The present application claims the filing benefits of U.S. provisional application Ser. No. 63/268,854, filed Mar. 4, 2022, which is hereby incorporated herein by reference in its entirety.

FIELD OF THE INVENTION

The present invention relates generally to the field of overhead consoles and associated accessories for vehicles.

BACKGROUND OF THE INVENTION

It is known to provide an overhead console at a roof/headliner of a vehicle. Overhead consoles are typically mounted to the vehicle headliner and typically include lighting features and control switches.

SUMMARY OF THE INVENTION

A vehicular overhead console and accessory system includes a body portion of the overhead console that mounts at an interior portion of the vehicle. A primary printed circuit board (PCB) is coupled to the body portion, and a flexible or rigid flexible printed circuit board (PCB) is operably coupled to the primary PCB via press-fit pins molded with the body portion. A secondary printed circuit board (PCB) is communicatively coupled to the primary PCB via the flexible or rigid flexible PCB, and at least one electronic accessory is disposed in the body portion and operably coupled to at least one of the primary PCB or the secondary PCB via the flexible PCB.

These and other objects, advantages, purposes and features of the present invention will become apparent upon review of the following specification in conjunction with the drawings.

DESCRIPTION OF THE PREFERRED EMBODIMENTS

Figure 1:
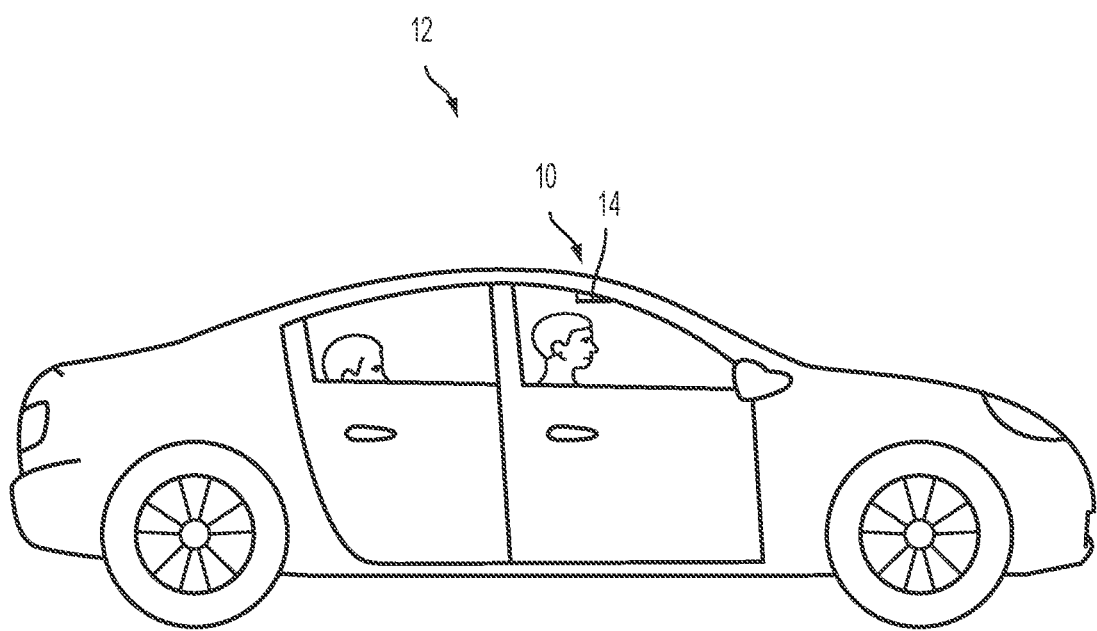
FIG. 1 is a side view of a vehicle with a vehicular overhead console installed at an interior portion of the vehicle.

Overhead consoles, windshield mounted electronics consoles, interior rearview mirror assemblies with integrated functionality, and other driver-accessible and/or vehicle occupant-accessible electronic modules or components are often installed in vehicles and provide functions that include advanced driver assist systems (ADAS), driver monitoring systems (DMS), occupant monitoring systems (OMS), interior lighting systems, emergency call systems, audio and/or video call systems, and the like. These systems may require electronic components, such as one or more cameras (such as a forward viewing camera having a field of view through the windshield of the vehicle or a driver facing camera at the interior of the vehicle having a field of view that includes a head region of the driver of the vehicle), an electronic control unit (ECU) with electronic circuitry and associated software that includes data and/or image processors, radar, lidar, rain/light/humidity sensor, a human machine interface (HMI) for receiving user inputs, and the like. Commonly, the electronic components enabling these systems are disposed at discrete and remote positions within the vehicle. That is, the necessary components (e.g., sensors, processors and any driver-accessible controls) for different systems are located at different positions within the vehicle (such as at the overhead console, interior rearview mirror assembly, windshield mounted module, center console and gauge cluster). Further, display related to the different systems is provided at separate and discrete display screens at different positions throughout the vehicle or projected onto the windshield as a head up display (HUD). This complicates the controls and information presented to the driver and reduces the driver's ability to control and/or understand such systems, therefore reducing the potential effectiveness of such systems for the driver. Additionally, placing the systems in various positions or integrating the systems into different existing components within the vehicle may result in the multiple systems being hosted across multiple ECUs on multiple printed circuit board assemblies (PCABs), thus complicating the processing and wireless and/or wired communication needs of the systems of the vehicle. Furthermore, the multiple components mount separately at the interior portion of the vehicle, such as to the headliner, the interior facing surface of the windshield, or the dashboard of the vehicle.

As described further below, a vehicular accessories system or overhead console is mounted at the interior portion of the vehicle (such as to the windshield, the headliner, or a frame or glass panel of a sunroof or panoramic glass roof of the vehicle) and houses or accommodates electric components (such as sensors, printed circuit boards (PCBs), light sources, and the like) for one or more functions of the overhead console or systems of the vehicle. For example, the overhead console may include light sources to provide an interior lighting system of the vehicle, such as to provide illumination modules for an occupant monitoring system (OMS) or driver monitoring system (DMS), dome lighting, map lights, a gear selector indicator (e.g., PRNDL), an illuminated logo, directional lighting, indirect ambient lighting, galaxy lighting and/or ambient lighting at the interior of the vehicle. The vehicular accessory system may include one or more cameras and/or sensors that capture sensor data and an electronic control unit (ECU) having an image and/or data processor that processes the captured sensor data for a system of the vehicle.

Figure 2:
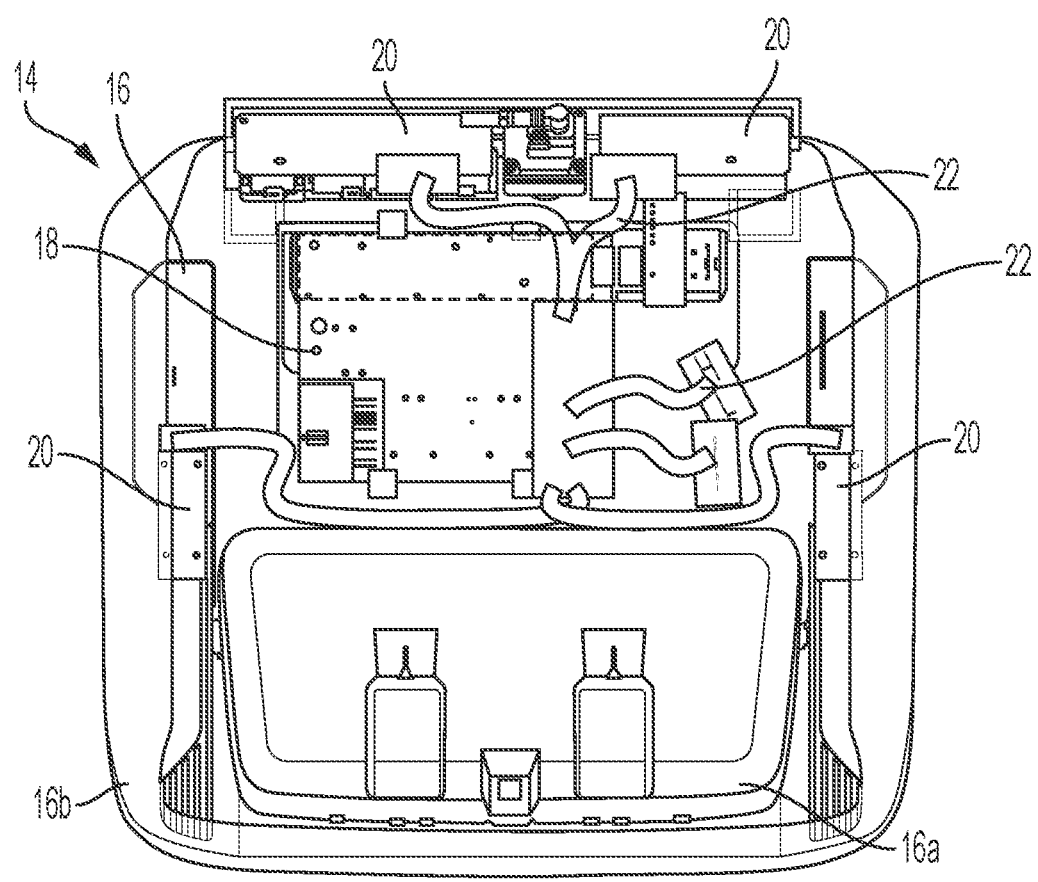
FIG. 2 is a plan view of a vehicular overhead console.

Referring now to the drawings and the illustrative embodiments depicted therein, a vehicular accessory system 10 is disposed at an interior portion or cabin of a vehicle 12 (FIG. 1). The system 10 includes an overhead console 14. The overhead console 14 is mounted at the interior portion of the vehicle (such as to an upper edge region of the windshield or the headliner of the vehicle) and extends rearward from the windshield along the headliner (such as shown in FIG. 1). The overhead console 14 includes a body portion or base portion or housing portion 16 in which a primary printed circuit board (PCB) 18 and one or more secondary PCBs 20 are disposed (FIG. 2). The primary PCB 18 may be electrically coupled to the one or more secondary PCBs 20 via one or more electrical connectors, such as flexible or flexible rigid PCBs 22 (e.g., FIG. 3). As described further below, the one or more secondary PCBs 20 may be associated with the one or more electronic components (e.g., sensors, light sources, user inputs and the like) accommodated by the overhead console 14 and the primary PCB 18 may include electronic circuitry to provide the ECU for processing sensor data and/or electronic signals from the one or more secondary PCBs 20.

In the illustrated embodiment, the body portion or housing portion 16 includes a mounting structure 16*a* that is configured to mount the overhead console 14 at a mounting region at the interior portion of the vehicle, such as the upper edge region of the windshield or at the headliner or at any intermediate structure of the vehicle roof (such as at a forward frame portion of a sunroof or panoramic roof of the vehicle). The mounting structure 16*a* may adhesively attach at the windshield or headliner or panoramic roof, or may be fastened to the headliner or frame of the windshield or panoramic roof via a plurality of fasteners (e.g., snap fasteners or clips or threaded fasteners or screws). The body portion 16 also includes a peripheral portion or outer shell 16*b* that extends from the mounting structure 16*a* and that may be attached at the headliner and/or a glass panel of the sunroof or panoramic roof of the vehicle or may be positioned below the glass panel of the sunroof or panoramic roof of the vehicle.

In other words, the overhead console 14 includes the body or housing 16 including mounting structure 16*a* that, when the overhead console 14 is installed at the vehicle 12, mounts or attaches or couples the overhead console 14 at the mounting region or portion at the interior portion of the vehicle 12. With the mounting structure 16*a* mounted at the interior portion of the vehicle, the peripheral portion or outer shell 16*b* of the body portion 16 extends from the mounting structure 16*a* and along the interior portion of the vehicle. For example, with the mounting structure 16*a* mounted along the upper edge portion of the vehicle windshield, the outer shell 16*b* may extend at least partially rearward from the mounting structure 16*a* and along the headliner of the vehicle. The primary PCB 18, the secondary PCB 20, the flexible PCB 22 and any other electronic components may be accommodated by the body or housing 16 of the overhead console 14 between the body portion and the interior portion of the vehicle (e.g., the vehicle headliner). Optionally, a second body or housing portion may couple to the body portion 16 to house the electronic components therebetween.

The electronic content or features or components or elements (e.g., circuitry, lighting, user inputs, controls etc.) of the overhead console are integrated into the body portion 16 of the overhead console. The body portion may be opaque to hide the electronic content or features from occupants of the vehicle. Optionally, the body portion may be transparent or translucent or light transmitting or partially transparent or translucent or light transmitting. For example, the body portion may include a light transmitting panel and one or more sensors, light sources and/or user actuatable inputs may be disposed at the light transmitting panel.

Optionally, the overhead console 14 may include an electronic control unit (ECU) disposed thereat, the ECU including electronic circuitry and associated software configured to provide one or more electronic functions of the console or of an accessory or system of the vehicle. For example, the primary PCB 18 may accommodate the electronic circuitry of the ECU. The one or more secondary PCBs 20 may be associated with one or more electronic functions of the overhead console 14, such as light sources, sensors (e.g., a camera, a glare light sensor, a microphone, and the like) and/or user inputs (e.g., buttons or switches for actuating electronic functions of the overhead console). Thus, the secondary PCBs 20 may be positioned within the body 16 of the overhead console according to the associated function of the secondary PCB, such as at a position corresponding to the position of the associated sensor or user input within the body 16 of the overhead console, and may be remote from the primary PCB 18.

Optionally, the secondary PCBs 20 may execute remote communication functionality and accessory functionality (e.g., one or more lights or displays or a garage door opener or the like). Optionally, the secondary PCBs 20 may also be integrated with microphones 24 or other audio sensors. Optionally, the overhead console 14 may include user inputs or electronic switches or human machine interface (HMI) features so that a user can actuate one or more accessories (e.g., one or more lights or displays or the garage door opener or the like) of the overhead console or of the vehicle. For example, the overhead console 14 may provide touch or proximity sensors (such as transparent capacitive foils or the like) to provide the HMI features to the transparent or light transmitting panel of the console. The sensors or user inputs may be colored or illuminated or otherwise demarcated so as to be visible at the light transmitting panel. Optionally, the user inputs may be covert when not in use and may be colored or illuminated or otherwise demarcated so as to be visible at the light transmitting panel responsive to actuation of a user input or detection of a person's hand at or near the panel or other triggering event. Optionally, the secondary PCBs 20 may be configured to execute functions associated with hazards, OnStar® capabilities, and may include automotive operating systems (AOS).

Figure 3:
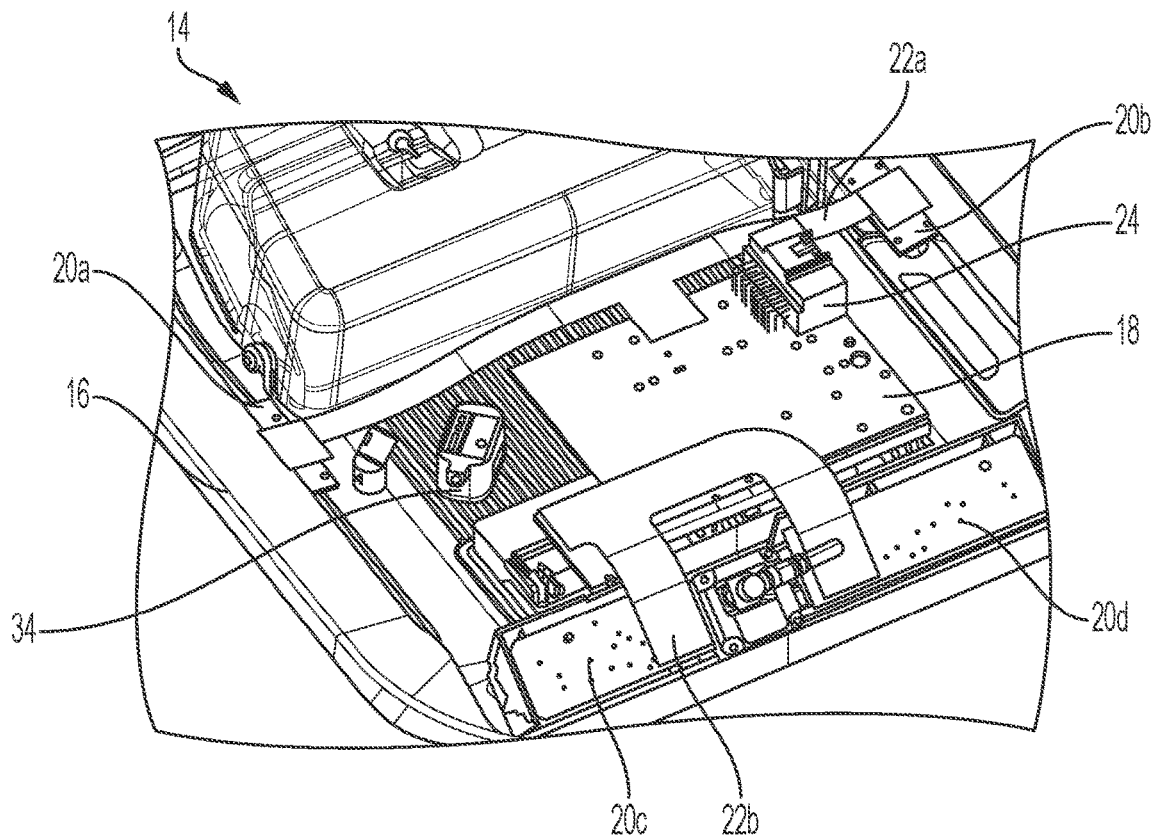
FIG. 3 is a partial perspective view of a vehicular overhead console with flexible printed circuit boards (PCBs) interconnected with additional circuit boards of the vehicular overhead console.
Figure 4:
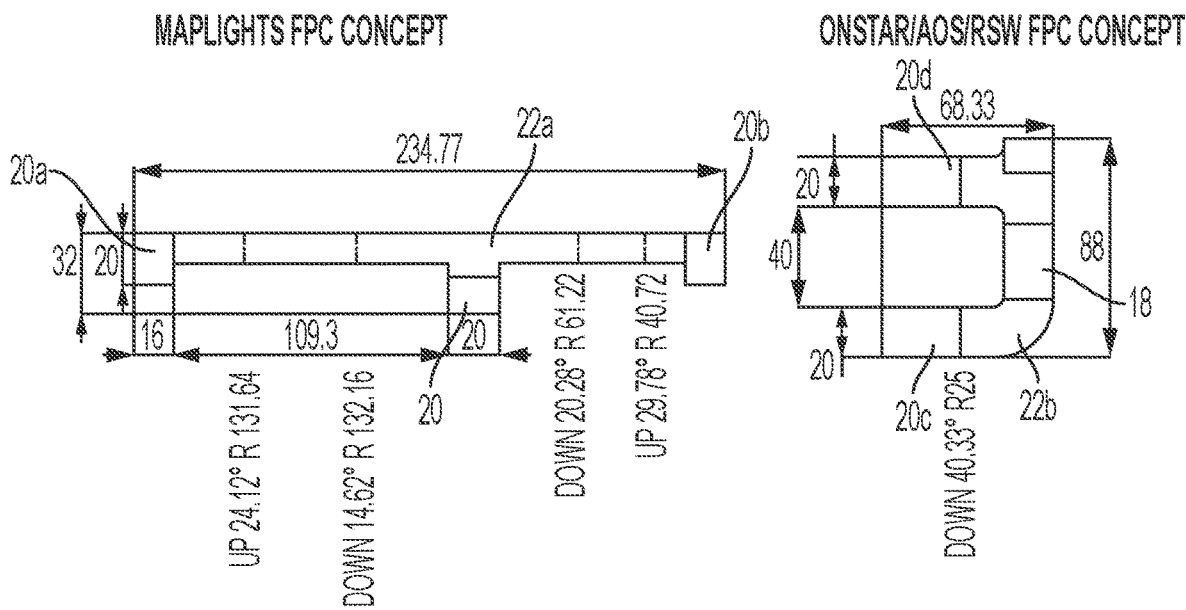
FIG. 4 is a schematic diagram of the flexible PCBs of the vehicular overhead console.

Referring to FIGS. 2-4, the secondary PCBs 20 are communicatively coupled to the primary PCB 18 via the flexible PCBs or flexible connectors 22. The flexible PCBs 22 may extend along the body portion 16 of the overhead console 14 to interconnect multiple secondary PCBs 20 with the primary PCB 18. The flexible PCBs 22 may comprise any suitable shape or configuration based on the orientation and positioning of the primary PCB 18 and the secondary PCBs 20. For example, a first flexible PCB 22*a* may extend between a first secondary PCB 20*a* and a second secondary PCB 20*b* and centrally couple with the primary PCB 18. The first flexible PCB 22*a* may comprise an I-shape or a T-shape to extend between the first and second secondary PCBs disposed on opposing sides of the overhead console from the centrally located primary PCB 18. A substantially U-shaped second flexible PCB 22*b* may couple a third secondary PCB 20*c* and a fourth secondary PCB 20*d* with the primary PCB 18, where the third secondary PCB 20*c* and the fourth secondary PCB 20d are respectively coupled to each end of the U-shaped flexible PCB 22b and the primary PCB 18 is coupled to the crook of the U-shaped flexible PCB 22b.

That is, the one or more flexible PCBs 22 electrically couple to and extend between the primary PCB 18 and the one or more secondary PCBs 20. The flexible PCBs 22 may be routed along the body portion 16 of the overhead console 14 and flexed to conform to the body and structure of the overhead console and electronic components. Thus, the secondary PCBs 20 may be positioned remote from the primary PCB 18 and at any suitable position along the body portion 16 of the overhead console 14, with the flexible PCBs 22 flexing and bending to accommodate structure between the primary PCB 18 and the connected secondary PCB 20. The flexible PCBs 22 may be configured to flex and/or bend responsive to tactile engagement. For example, the user may press on a tactile feature of the overhead console 14 (e.g., a user actuatable input) to activate an illumination feature, and the flexible PCB(s) 22 may at least partially bend or flex to accommodate movement of the tactile feature and/or secondary PCB relative to the housing portion 16.

Figure 5A:
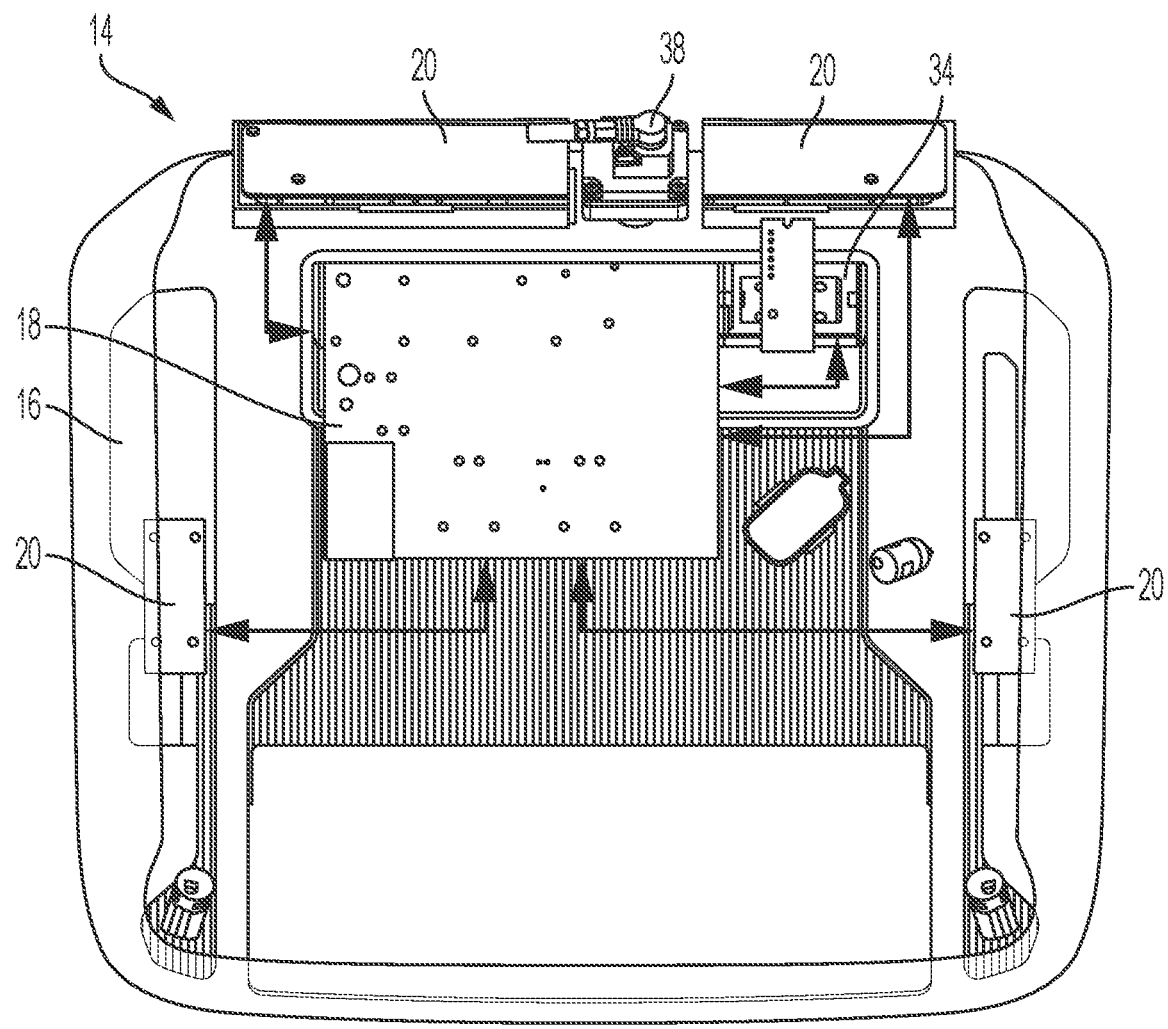
FIG. 5A is another plan view of the vehicular overhead console, showing various printed circuit boards and connecting features.
Figure 5B:
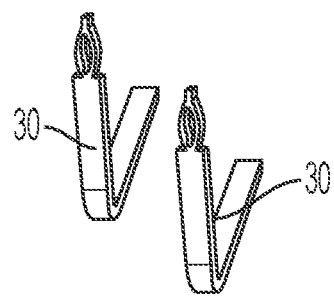
FIG. 5B is a perspective view of press fit pins of the vehicular overhead console of FIG. 5A.
Figure 5C:
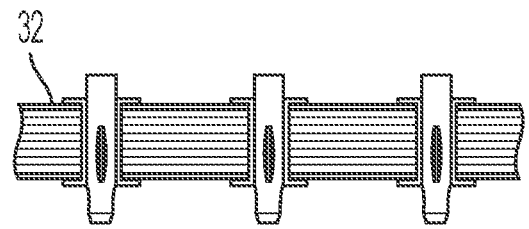
FIG. 5C is a sectional view of electrical connectors through a printed circuit board of the vehicular overhead console.

Referring now to FIGS. 5A-5C, the primary PCB 18 and each of the secondary PCBs 20 may be coupled to the body portion 16 of the overhead console 14 via press-fit or flexible or compliant pins 30 (FIG. 5B). The press-fit pins 30 may also couple the flexible PCBs 22 to each of the primary PCB 18 and the secondary PCBs 20. The press-fit pins 30 may be molded via a stamping process and vertically and robotically assembled. For example, the press-fit pins 30 may be molded in a separate plastic piece, which may maximize the thermal efficiency of stamping. The press-fit pins 30 may be overmolded into or integrated with the overhead console 14 for a plug-and-play feature assembly. The automated molded stamping process may deactivate a feature not used and utilizes FFT test points for verification.

In other words, the press-fit pins 30 may be overmolded into the body portion 16 of the overhead console 14 at positions corresponding to the primary PCB 18, one or more secondary PCBs 20 and/or one or more flexible PCBs 22. The primary PCB 18, secondary PCBs 20 and flexible PCBs 22 may then be positioned at the body portion 16 of the overhead console 14 and press-fit to the press-fit pins 30 to secure the components at the overhead console 14. For example, the components may be robotically assembled to the overhead console 14 using a vertical press-fit motion. That is, the components may be assembled to the overhead console 14 via a linear or axial motion, resulting in a simpler and faster (and optionally automated) assembly process.

Optionally, the primary PCB 18 and one or more secondary PCBs 20 may be electrically coupled via one or more flexible PCBs 22 prior to assembly with the body portion 16 of the overhead console 14. Thus, the primary PCB 18 and the one or more connected secondary PCBs 20 may be press-fit at the overhead console 14 collectively in a single assembly step. The flexible PCBs 22 flex during attachment to the body portion 16 and may conform to an inner surface of the body portion 16, such as to accommodate movement of the primary PCB 18 and secondary PCBs 20 relative to the flexible PCBs 22 during the installation process that attaches the primary PCB and secondary PCBs at the body portion of the overhead console via, for example, the press-fit attachment.

Optionally, the primary PCB 18 and the one or more secondary PCBs 20 may be coupled to the base portion 16 of the overhead console 14 and then electrically connected via the one or more flexible PCBs 22. Thus, the flexible PCBs 22 may flex during assembly and conform to the PCBs and surfaces of the body portion 16, such as to accommodate tolerances in position of the primary PCB 18 and secondary PCBs 20.

The overhead console 14 may include one or more electrical connectors 32 that may be electrically coupled to each of the primary PCB 18, the secondary PCBs 20 and/or the flexible PCBs 22. The electrical connectors 32 may be inserted or received through vias or passageways or channels in one or more of the PCBs to electrically connect the PCBs and/or to electrically connect one or more electrical components to circuitry of one or more of the PCBs. The electrical connectors 32 may assist with electrically powering various features 34 of the overhead console 14 including telematics, map lights, mood lights, hazard indicators, sunroof controls, blind zone indicators, rear window controls, automatic occupant sensors, universal garage door opener, seat belt indicators for multiple rows, tire pressure monitoring indicators and/or information indicators, such as fuel level indicators. For example, the flexible PCBs 22 may cooperate with the electrical connectors 32 to couple features, such as an electrical wire harness, a universal garage door opener system or GDO (e.g., HOMELINK®) harness and two or more PCBs may be connected via Xpins that provide board to board connection of a secondary PCB to the primary PCB 18.

Figure 6A:
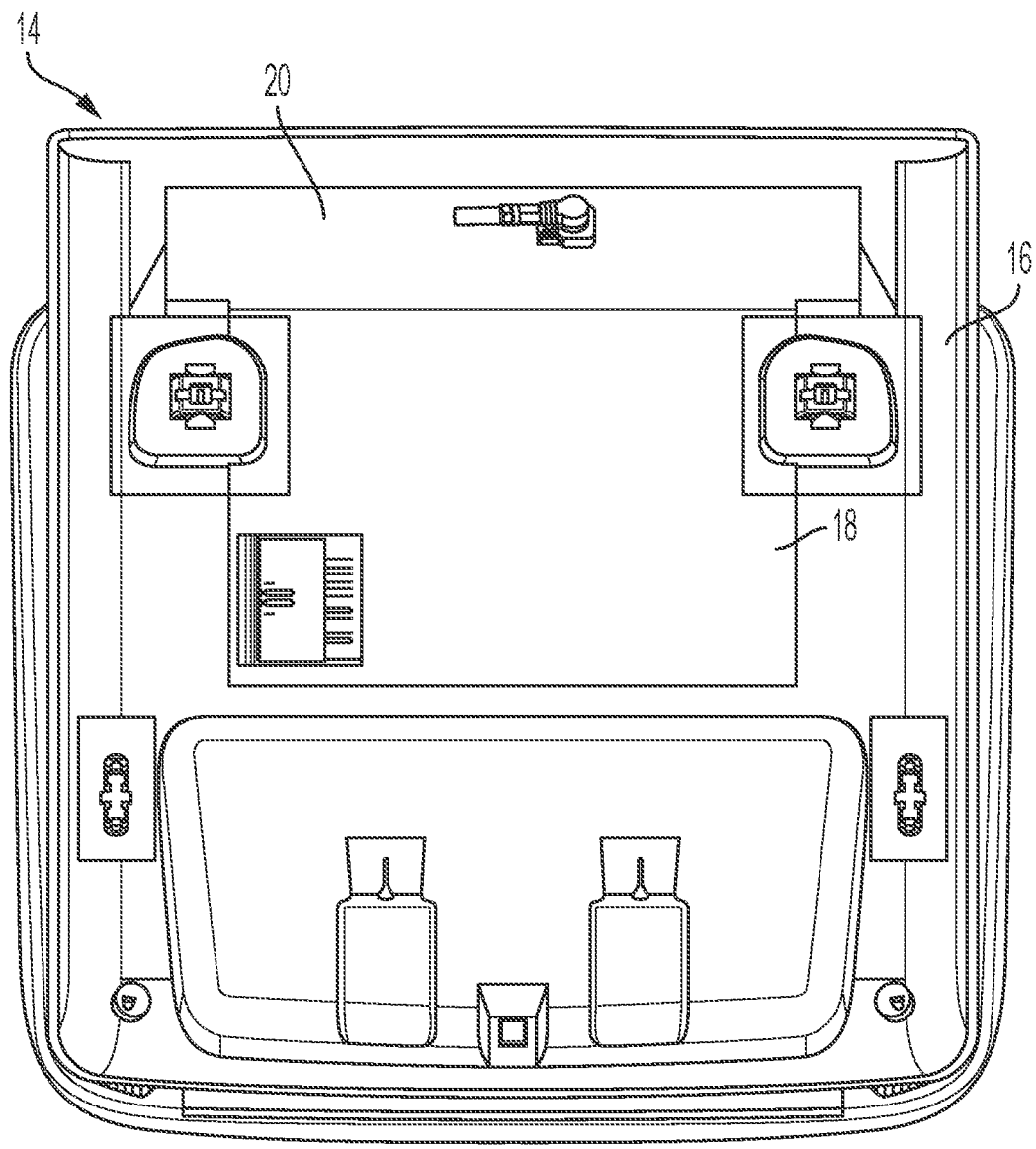
FIG. 6A is another plan view of the vehicular overhead console.
Figure 6B:
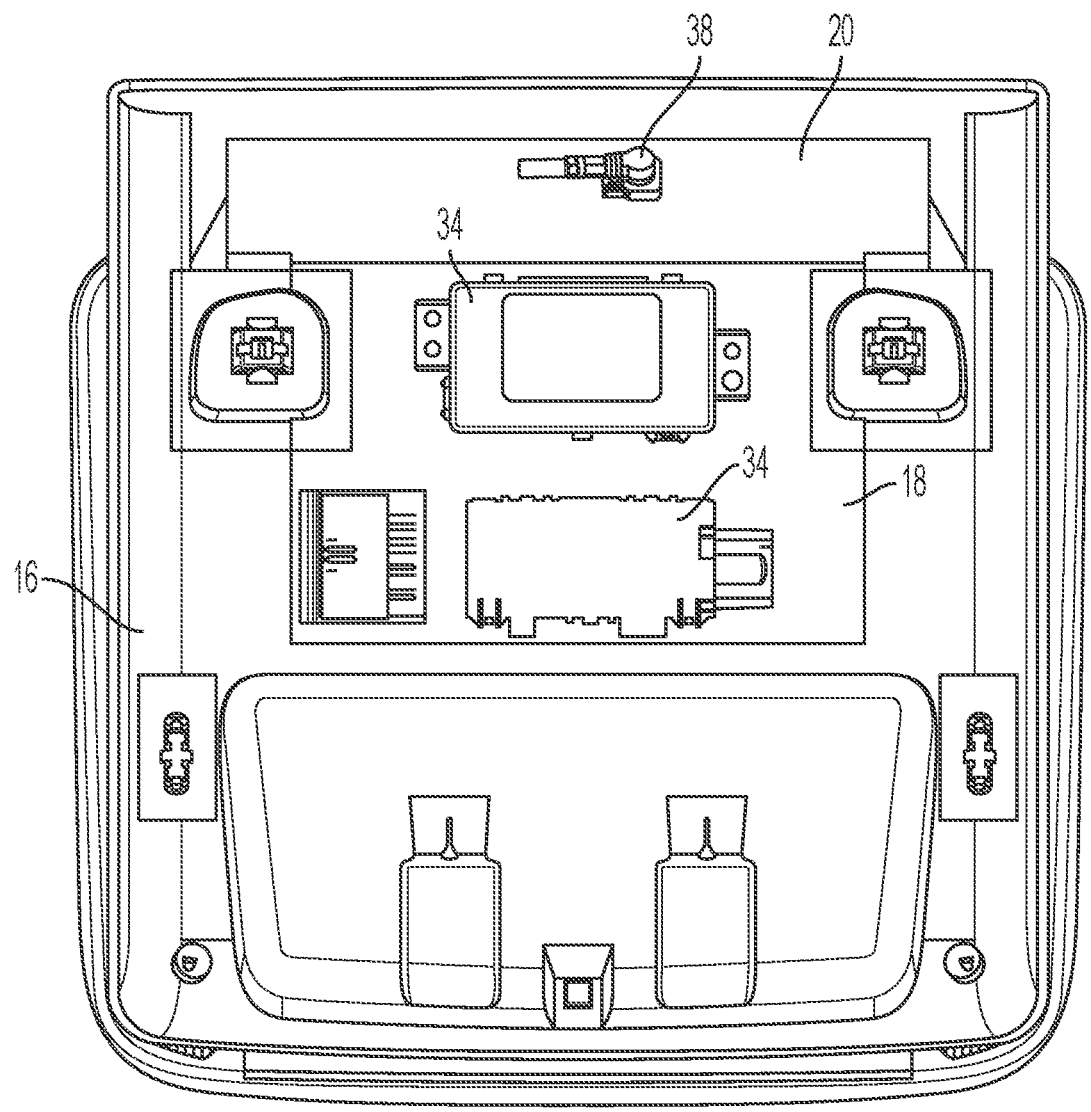
FIG. 6B is another plan view of the vehicular overhead console.
Figure 6C:
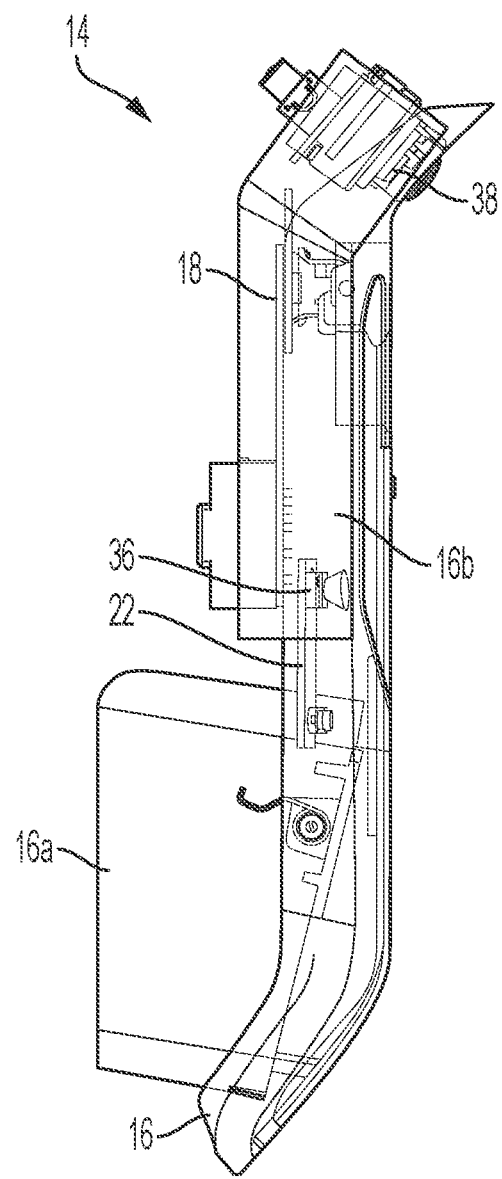
FIG. 6C is a sectional view of the vehicular overhead console of FIG. 6A.

FIG. 6B illustrates the placement of two of the various features 34, which may be coupled to the primary PCB 18. FIG. 6C illustrates a cross-sectional view of the overhead console 14, illustrating an actuation feature 36, which may be selectively engaged with the primary PCB 18 responsive to engagement from an occupant (such as when the user presses a button or switch at the overhead console). The actuation feature 36 may be flexed or urged toward the primary PCB 18 to engage the primary PCB 18 and may additionally or alternatively engage with at least one of the electrical connectors 32. The electrical connectors 32 may in turn engage or otherwise electrically communicate with the primary PCB 18. The general movement of the actuation feature 36 may be assisted in part by the flexible PCB(s) 22.

Optionally, the press-fit pins 30 may be overmolded with the base portion of the overhead console and along a route of one or more flexible PCBs 22 and/or electrical connectors 32. The press-fit pins 30 may secure the flexible PCB along the base portion 16 of the overhead console 14. For example, with the flexible PCB 22 and/or electrical connector 32 electrically coupled to the primary PCB 18 and the one or more secondary PCBs 20 and with the flexible PCB 22 and/or electrical connector 32 positioned at or near the press-fit pin 32, the press-fit pin 32 may be folded over and along the flexible PCB 22 and/or electrical connector 32 and secured (such as via a soldering or joining process).

Optionally, the overhead console 14 may include transparent displays that are covert when not activated and are visible at the light transmitting panel when activated (such as by utilizing aspects of the consoles described in International PCT Application No. PCT/EP2022/078520, filed Oct. 13, 2022, which is hereby incorporated herein by reference in its entirety. For example, the overhead console may provide information displays that, when energized, show vehicle status information, such as battery charge level, fuel level, speed, odometer, engine temperature, exterior temperature, compass heading, time, date, and/or the like. The displays may be reconfigurable so that the user of the vehicle may select what information is displayed, and optionally may select the color of the displayed information. The transparent displays may be used to display information and may also incorporate capacitive touch functionality (where the user may touch different areas of the overhead console to display different information at the light transmitting panel).

Optionally, the overhead console may provide lighting features, such as in-cabin lighting, map reading lights, and/or the like. The lights may comprise micro LEDs or may comprise other not readily discernible light sources disposed at the light transmitting panel (such that the light sources are covert when not energized and visible when energized). The light sources may also provide non-visible light, such as near infrared lighting (e.g., the light sources may comprise near-infrared light-emitting LEDs), such as for use with a driver monitoring system (DMS) or occupant monitoring system (OMS) of the vehicle. Optionally, the overhead console may provide perimeter lighting and/or in-cabin lighting or the like, and may provide user actuatable inputs for controlling the lighting and/or other accessories, such as by utilizing aspects of the overhead consoles described in U.S. patent application Ser. No. 17/931,988, filed Sep. 14, 2022, which published on Mar. 16, 2023 as U.S. Patent Publication No. 2023/0078512, which is hereby incorporated herein by reference in its entirety.

The overhead console is electrically powered by a power source of the vehicle, such as via connection to a wiring harness of the vehicle. The overhead console may electrically connect to the vehicle wiring harness at the headliner. Thus, the overhead console provides a module that is mounted at an interior portion of the vehicle to provide lighting and/or controls, while also allowing for a larger panoramic roof.

The overhead console thus may house electrical components in addition to the primary PCB and secondary PCBs (such as sensors, light sources, etc.). For example, the overhead console may include light sources to provide lighting at the interior portion of the vehicle. For example, the light sources may provide illumination modules such as for an OMS or DMS (where the light sources may comprise near infrared light emitting light sources or the like), dome lighting, map lights, an illuminated logo, directional lighting, galaxy lighting and/or ambient or accent lighting at the interior portion of the vehicle. The light source or light sources may comprise one or more light emitting diodes (LEDs) or a plurality of micro-LEDs or vertical-cavity surface-emitting lasers (VCSELs) or the like. The lighting may be adjustable, such as to control the brightness or color of the light emitted by the light sources. Furthermore, the lighting may be electrically operable responsive to a user input or may be automatically energized, such as responsive to opening of a door of the vehicle.

The overhead console may include a human machine interface (HMI) configured to receive a user input, such as to control a system or function of the vehicle. The HMI may be disposed at an underside of the overhead console and, when actuated by a user, control operation of a light or other accessory. For example, the one or more inputs may control function of reading lights of the vehicle or the accent lighting of the overhead console or a system of the vehicle.

The user actuatable HMI of the overhead console may comprise any suitable input, such as switches, buttons, or capacitive sensors. Optionally, the user actuatable input may be provided by a piezo-electric actuator configured to sense the amount of force provided by a user and provide haptic feedback to the user providing the input. Optionally, the user actuatable inputs may be changeable or adjustable, where the function or control provided by a given input may change responsive to a condition of the vehicle or responsive to another user input. For example, the HMI may provide a series of default functions provided by the user actuatable inputs, and upon selection by a user of one of the user actuatable inputs, the HMI may adjust the functions provided by the user actuatable inputs to provide functions based on the initially selected input, such as an initial input selection of a single input to control a sunroof function of the vehicle and subsequent adjustment of the plurality of inputs to provide different functions of the sunroof of the vehicle.

The overhead console and the lighting devices, HMI and other accessories may utilize characteristics of the overhead consoles and window assemblies described in U.S. Pat. Nos. 10,559,153; 10,427,503 and/or 10,272,833 and/or U.S. Patent Pub. No. US-2021-0188092, which are hereby incorporated by reference herein in their entireties.

The overhead console may include user actuatable inputs operable to control any of the accessories of or associated with the overhead console (e.g., telematics buttons). For example, the overhead console may include touch sensitive elements or touch sensors or proximity sensors, such as the types of touch sensitive elements described in U.S. Pat. Nos. 5,594,222; 6,001,486; 6,310,611; 6,320,282; 6,627,918; 7,224,324 and/or 7,253,723, and/or U.S. Publication Nos. US-2014-0022390 and/or US-2014-0293169, which are hereby incorporated herein by reference in their entireties, or such as proximity sensors of the types described in U.S. Pat. Nos. 7,224,324; 7,249,860 and/or 7,446,924, and/or U.S. Publication No. US-2006-0050018, which are hereby incorporated herein by reference in their entireties, or such as membrane type switches, such as described in U.S. Pat. No. 7,360,932, which is hereby incorporated herein by reference in its entirety, or such as detectors and the like, such as the types disclosed in U.S. Pat. Nos. 7,255,541; 6,504,531; 6,501,465; 6,492,980; 6,452,479; 6,437,258 and/or 6,369,804, which are hereby incorporated herein by reference in their entireties, and/or the like, while remaining within the spirit and scope of the present invention.

Optionally, the overhead console may be integrated or mounted directly to the roof or sunroof or moonroof or panoramic roof of the vehicle, such that a surface of the overhead console may be exposed exterior of the vehicle or is disposed at an at least partially transparent surface (e.g., glass) of the roof of the vehicle. The overhead console may thus include solar cells to capture solar energy as a power source for the vehicle and/or accessories. The overhead console may include an antenna, such as an omnidirectional antenna and/or a radio or communications antenna. Optionally, the overhead console or system includes drivers for the sunroof or moonroof of the vehicle.

Optionally, one or more sensors (such as a radar sensor or an imaging sensor or camera) may be disposed at the overhead console and capture data representative of a field of sensing interior of the vehicle and the ECU at the overhead console may process the captured data for a system of the vehicle. For example, a camera 38 that has a field of view interior the cabin of the vehicle may capture image data and the ECU may process captured image data such as for a DMS or OMS of the vehicle. The camera may be disposed at or in the overhead console and view through an aperture in the housing or frame of the overhead console or the camera may be disposed at the interior rearview mirror. The camera has a view interior the vehicle, such as at a head region of the driver of the vehicle, and may utilize characteristics of the DMS described in U.S. patent application Ser. No. 17/905,109, filed Aug. 26, 2022, now U.S. Pat. No. 11,639,134, which is hereby incorporated herein by reference in its entirety. By positioning the camera at the overhead console, the camera may provide an enhanced view of the rear seats of the vehicle for an occupant monitoring function. The console and/or DMS/OMS camera and/or DMS/OMS or head and face direction and/or position tracking systems and/or eye tracking systems and/or gesture recognition systems may utilize aspects of the systems described in U.S. Pat. Nos. 11,518,401; 10,065,574; 10,017, 114; 9,405,120 and/or 7,914,187, and/or U.S. Publication Nos. US-2022-0377219; US-2022-0254132; US-2022-0242438; US-2021-0323473; US-2021-0291739; US-2020-0202151; US-2020-0143560; US-2019-0210615; US-2018-0222414; US-2017-0274906; US-2017-0217367; US-2016-0209647; US-2016-0137126; US-2015-0352953; US-2015-0296135; US-2015-0294169; US-2015-0232030; US-2015-0092042; US-2015-0022664; US-2015-0015710; US-2015-0009010 and/or US-2014-0336876, and/or US-2014-0336876, and/or International PCT Application No. PCT/US2022/075887, filed Sep. 2, 2022, which published on Mar. 9, 2023 as International Publication No. WO2023/034956, and/or International Publication Nos. WO 2022/241423 and/or WO 2022/187805, which are all hereby incorporated herein by reference in their entireties.

Optionally, the overhead console may include one or more other displays or indicators, such as the types described in U.S. Pat. Nos. 8,890,955; 7,855,755; 7,338,177; 7,274,501; 7,255,451; 7,195,381; 7,184,190; 7,046,448; 5,668,663; 5,724,187; 5,530,240; 6,329,925; 6,690,268; 7,734,392; 7,370,983; 6,902,284; 6,428,172; 6,420,975; 5,416,313; 5,285,060; 5,193,029 and/or 4,793,690, and/or in U.S. Pat. Pub. Nos. US-2006-0050018; US-2009-0015736; US-2009-0015736 and/or US-2010-0097469, which are all hereby incorporated herein by reference in their entireties.

The user actuatable inputs and/or touch sensors and/or proximity sensors and displays described above may be actuatable to control and/or adjust the accessories of the overhead console and/or vehicle. The connection or link between the controls and the display screen device and/or the navigation system and/or other systems and accessories of the overhead console or vehicle may be provided via vehicle electronic or communication systems and the like, and may be connected via various protocols or nodes, such as BLUETOOTH®, SCP, UBP, J1850, CAN J2284, Fire Wire 1394, MOST, LIN, FLEXRAY™, Byte Flight and/or the like, or other vehicle-based or in-vehicle communication links or systems (such as WIFI and/or IRDA) and/or the like, or via VHF or UHF or other wireless transmission formats, depending on the particular application of the overhead console/accessory system and the vehicle. Optionally, the connections or links may be provided via various wireless connectivity or links, without affecting the scope of the present invention.

An interior rearview mirror may be mounted at or attached to or integrally formed with the forward frame portion of the overhead console. The interior rearview mirror is adjustably mounted to the overhead console via mounting structure. The mirror reflective element may comprise any suitable mirror reflective element, such as a variable reflectance electro-optic mirror reflective element that varies its reflectance responsive to electrical current applied to conductive coatings or layers of the reflective element, such as a mirror reflective element that utilizes characteristics of the interior rearview mirror assemblies described in U.S. Pat. Nos. 7,274,501; 7,255,451; 7,195, 381; 7,184,190; 6,690,268; 5,140,455; 5,151,816; 6,178, 034; 6,154,306; 6,002,544; 5,567,360; 5,525,264; 5,610, 756; 5,406,414; 5,253,109; 5,076,673; 5,073,012; 5,117, 346; 5,724,187; 5,668,663; 5,910,854; 5,142,407 and/or 4,712,879, which are hereby incorporated herein by reference in their entireties. Optionally, the mirror reflective element may comprise a dual-mode interior rearview video mirror that can switch from a traditional reflection mode to a live-video display mode, such as is by utilizing aspects of the mirror assemblies and systems described in U.S. Pat. Nos. 10,442,360; 10,421,404; 10,166,924 and/or 10,046, 706, and/or U.S. Publication Nos. US-2021-0245662; US-2021-0162926; US-2021-0155167; US-2020-0377022; US-2019-0258131; US-2019-0146297; US-2019-0118717 and/or US-2017-0355312, which are hereby incorporated herein by reference in their entireties. The video display screen of the video mirror, when the mirror is in the display mode, may display video images derived from video image data captured by a rearward viewing camera, such as a rearward camera disposed at a center high-mounted stop lamp (CHMSL) location, and/or video image data captured by one or more other cameras at the vehicle, such as side-mounted rearward viewing cameras or the like.

Changes and modifications in the specifically described embodiments may be carried out without departing from the principles of the present invention, which is intended to be limited only by the scope of the appended claims as interpreted according to the principles of patent law.

The invention claimed is:

1. A vehicular overhead console module, the vehicular overhead console module comprising:
 a base portion configured to attach at an interior portion of a vehicle to mount the vehicular overhead console module at the interior portion of the vehicle;
 a primary printed circuit board (primary PCB) accommodated by the base portion, wherein the primary PCB comprises electronic circuitry;
 a secondary printed circuit board (secondary PCB) accommodated by the base portion, wherein the secondary PCB is disposed at the base portion and spaced from the primary PCB;
 wherein the secondary PCB is electrically connected to an electronic component accommodated by the base portion, and wherein the secondary PCB comprises electronic circuitry associated with the electronic component;
 wherein the electronic circuitry of the primary PCB includes a processor for processing electronic signals received from the secondary PCB;
 wherein the primary PCB and the secondary PCB are secured at the base portion via one or more press-fit pins of the base portion;
 a flexible electrical connection electrically connecting the primary PCB and the secondary PCB;
 wherein the flexible electrical connection, with the primary PCB and the secondary PCB secured at the base portion, flexes to conform to an inner surface of the base portion between the primary PCB and the secondary PCB; and
 wherein, with the base portion attached at the interior portion of the vehicle, the electronic circuitry of the primary PCB and the electronic circuitry of the secondary PCB electrically communicate via the flexible electrical connection.

2. The vehicular overhead console module of claim 1, wherein the flexible electrical connection comprises a flexible printed circuit board (flexible PCB).

3. The vehicular overhead console module of claim 1, wherein the flexible electrical connection comprises a flexible ribbon cable.

4. The vehicular overhead console module of claim 1, wherein the flexible electrical connection extends between the primary PCB and the secondary PCB and along the inner surface of the base portion.

5. The vehicular overhead console module of claim 4, wherein a tactile feature of the overhead console module is disposed at an outer surface of the base portion, and wherein the inner surface of the base portion, when the tactile feature is engaged by a user, flexes or moves responsive to the tactile feature being engaged by the user, and wherein the flexible electrical connection flexes or moves to accommodate flexing or movement of the inner surface of the base portion.

6. The vehicular overhead console module of claim 1, wherein the base portion comprises (i) an attaching portion that is configured to attach at the interior portion of the vehicle and (ii) a housing portion that, with the attaching portion attached at the interior portion of the vehicle, extends from the attaching portion and along the interior portion of the vehicle.

7. The vehicular overhead console module of claim 6, wherein the housing portion accommodates the primary PCB, the secondary PCB and the flexible electrical connection.

8. The vehicular overhead console module of claim 1, wherein the electronic component comprises a light source.

9. The vehicular overhead console module of claim 1, wherein the flexible electrical connection comprises a flexible printed circuit board (flexible PCB), and wherein the flexible PCB is electrically connected to a first secondary PCB, a second secondary PCB and the primary PCB.

10. The vehicular overhead console module of claim 9, wherein the flexible PCB comprises a U-shaped flexible PCB.

11. The vehicular overhead console module of claim 1, wherein the flexible electrical connection comprises a first flexible printed circuit board (PCB) and a second flexible PCB, and wherein the first flexible PCB is electrically connected to a first secondary PCB and the primary PCB, and wherein the second flexible PCB is electrically connected to a second secondary PCB and the primary PCB.

12. The vehicular overhead console module of claim 1, wherein the base portion accommodates a plurality of secondary PCBs and a plurality of electronic components, and wherein each electronic component of the plurality of electronic components is connected to a respective secondary PCB of the plurality of secondary PCBs, and wherein each respective secondary PCB of the plurality of secondary PCBs comprises electronic circuitry associated with the corresponding electronic component of the plurality of electronic components.

13. The vehicular overhead console module of claim 12, wherein each secondary PCB of the plurality of secondary PCBs is electrically connected to the primary PCB via a respective flexible electrical connection.

14. The vehicular overhead console module of claim 12, wherein the electronic circuitry of the primary PCB electrically communicates with the electronic circuitry of each secondary PCB of the plurality of secondary PCBs.

15. The vehicular overhead console module of claim 1, wherein the electronic component comprises a cabin monitoring camera that captures image data for use with a driver monitoring system or an occupant monitoring system, and wherein the processor of the primary PCB comprises an image processor for processing image data captured by the cabin monitoring camera.

16. The vehicular overhead console module of claim 1, wherein the primary PCB and the secondary PCB are electrically connected via the flexible electrical connection before the primary PCB and the secondary PCB are secured at the base portion, and wherein, with the primary PCB and the secondary PCB electrically connected via the flexible electrical connection and when the primary PCB and the secondary PCB are secured at the base portion via the one or more press-fit pins, the flexible electrical connection flexes and conforms to the inner surface of the base portion to allow for the attachment of the primary PCB and the secondary PCB to the base portion.

17. The vehicular overhead console module of claim 1, wherein the one or more press-fit pins is integrally formed with the base portion.

18. A vehicular overhead console module, the vehicular overhead console module comprising:

a base portion configured to attach at an interior portion of a vehicle to mount the vehicular overhead console module at the interior portion of the vehicle;

a primary printed circuit board (primary PCB) accommodated by the base portion, wherein the primary PCB comprises electronic circuitry;

a first secondary printed circuit board (secondary PCB) accommodated by the base portion;

a second secondary PCB accommodated by the base portion;

wherein the first secondary PCB and the second secondary PCB are disposed at the base portion and spaced from the primary PCB;

wherein the first secondary PCB and the second secondary PCB are electrically connected to respective electronic components accommodated by the base portion, and wherein the first secondary PCB and the second secondary PCB respectively comprise electronic circuitry associated with the respective electronic components;

wherein the electronic circuitry of the primary PCB includes a processor for processing respective electronic signals received from the first secondary PCB and the second secondary PCB;

wherein the primary PCB, the first secondary PCB and the second secondary PCB are secured at the base portion via one or more respective press-fit pins of the base portion;

a flexible printed circuit board (flexible PCB) electrically connecting the primary PCB and the first secondary PCB and the second secondary PCB;

wherein a first end of the flexible PCB is electrically connected to the first secondary PCB and a second end of the flexible PCB is electrically connected to the second secondary PCB, and wherein the flexible PCB is electrically connected to the primary PCB between the first end and the second end;

wherein the flexible PCB, with the primary PCB, the first secondary PCB and the second secondary PCB secured at the base portion, flexes to conform to an inner surface of the base portion between the primary PCB, the first secondary PCB and the second secondary PCB;

wherein the flexible PCB extends between the primary PCB, the first secondary PCB and the second secondary PCB and along the inner surface of the base portion; and wherein, with the base portion attached at the interior portion of the vehicle, the electronic circuitry of the primary PCB and the respective electronic circuitry of the first secondary PCB and the second secondary PCB electrically communicate via the flexible PCB.

19. The vehicular overhead console module of claim 18, wherein a tactile feature of the overhead console module is disposed at an outer surface of the base portion, and wherein the inner surface of the base portion, when the tactile feature is engaged by a user, flexes or moves responsive to the tactile feature being engaged by the user, and wherein the flexible PCB flexes or moves to accommodate flexing or movement of the inner surface of the base portion.

20. The vehicular overhead console module of claim 18, wherein the flexible PCB comprises a U-shaped flexible PCB.

21. The vehicular overhead console module of claim 18, wherein the primary PCB, the first secondary PCB and the second secondary PCB are electrically connected via the flexible PCB before the primary PCB, the first secondary PCB and the second secondary PCB are secured at the base portion, and wherein, with the primary PCB, the first secondary PCB and the second secondary PCB electrically connected via the flexible PCB and when the primary PCB, the first secondary PCB and the second secondary PCB are secured at the base portion via the one or more press-fit pins, the flexible PCB flexes and conforms to the inner surface of the base portion to allow for the attachment of the primary PCB, the first secondary PCB and the second secondary PCB to the base portion.

22. The vehicular overhead console module of claim 18, wherein the one or more respective press-fit pins are integrally formed with the base portion.

23. A vehicular overhead console module, the vehicular overhead console module comprising:
a base portion configured to attach at an interior portion of a vehicle to mount the vehicular overhead console module at the interior portion of the vehicle;
a primary printed circuit board (primary PCB) accommodated by the base portion, wherein the primary PCB comprises electronic circuitry;
a first secondary printed circuit board (secondary PCB) accommodated by the base portion;
a second secondary PCB accommodated by the base portion;
wherein the first secondary PCB and the second secondary PCB are disposed at the base portion and spaced from the primary PCB;
wherein the first secondary PCB and the second secondary PCB are electrically connected to respective electronic components accommodated by the base portion, and wherein the first secondary PCB and the second secondary PCB respectively comprise electronic circuitry associated with the respective electronic components;
wherein the electronic circuitry of the primary PCB includes a processor for processing respective electronic signals received from the first secondary PCB and the second secondary PCB;
wherein the primary PCB, the first secondary PCB and the second secondary PCB are secured at the base portion via one or more press-fit pins of the base portion;
a first flexible ribbon cable electrically connecting the primary PCB and the first secondary PCB;
a second flexible ribbon cable electrically connecting the primary PCB and the second secondary PCB;
wherein a first end of the first flexible ribbon cable is electrically connected to the primary PCB and a second end of the first flexible ribbon cable is electrically connected to the first secondary PCB;
wherein a first end of the second flexible ribbon cable is electrically connected to the primary PCB and a second end of the second flexible ribbon cable is electrically connected to the second secondary PCB;
wherein the first flexible ribbon cable and the second flexible ribbon cable, with the primary PCB, the first secondary PCB and the second secondary PCB secured at the base portion, flex to conform to an inner surface of the base portion between the primary PCB, the first secondary PCB and the second secondary PCB;
wherein the first flexible ribbon cable extends between the primary PCB and the first secondary PCB and along the inner surface of the base portion, and wherein the second flexible ribbon cable extends between the primary PCB and the second secondary PCB and along the inner surface of the base portion; and
wherein, with the base portion attached at the interior portion of the vehicle, the electronic circuitry of the primary PCB and the electronic circuitry of the first secondary PCB electrically communicate via the first flexible ribbon cable and the electronic circuitry of the primary PCB and the electronic circuitry of the second secondary PCB electrically communicate via the second flexible ribbon cable.

24. The vehicular overhead console module of claim 23, wherein the primary PCB, the first secondary PCB and the second secondary PCB are electrically connected, respectively, via the first flexible ribbon cable and the second flexible ribbon cable before the primary PCB, the first secondary PCB and the second secondary PCB are secured at the base portion, and wherein, with the primary PCB and the first secondary PCB electrically connected via the first flexible ribbon cable and the primary PCB and the second secondary PCB electrically connected via the second flexible ribbon cable and when the primary PCB, the first secondary PCB and the second secondary PCB are secured at the base portion via the one or more press-fit pins, the first flexible ribbon cable and the second flexible ribbon cable flex and conform to the inner surface of the base portion to allow for the attachment of the primary PCB, the first secondary PCB and the second secondary PCB to the base portion.

25. The vehicular overhead console module of claim 23, wherein the one or more press-fit pins is integrally formed with the base portion.

* * * * *